United States Patent
Moon (10) Patent No.: US 10,109,796 B2
(45) Date of Patent: Oct. 23, 2018

(54) METHODS OF APPLYING POLYMERS TO SURFACES AND SURFACES COATED BY POLYMERS

(75) Inventor: Kee Moon, San Diego, CA (US)

(73) Assignee: San Diego State University Research Foundation, San Diego, CA (US)

(*) Notice: Subject to any disclaimer, the term of this patent is extended or adjusted under 35 U.S.C. 154(b) by 2 days.

(21) Appl. No.: 13/978,089

(22) PCT Filed: Dec. 28, 2011

(86) PCT No.: PCT/US2011/067488
§ 371 (c)(1),
(2), (4) Date: Sep. 11, 2013

(87) PCT Pub. No.: WO2012/094200
PCT Pub. Date: Jul. 12, 2012

(65) Prior Publication Data
US 2013/0341611 A1 Dec. 26, 2013

Related U.S. Application Data

(60) Provisional application No. 61/429,702, filed on Jan. 4, 2011.

(51) Int. Cl.
*H01L 29/08* (2006.01)
*H01L 51/00* (2006.01)
(Continued)

(52) U.S. Cl.
CPC .. *H01L 51/0006* (2013.01); *H01L 31/022425* (2013.01); *H01L 31/18* (2013.01);
(Continued)

(58) Field of Classification Search
CPC ....... B05D 1/04; B05D 1/007; H01L 51/0005; H01L 51/0004; H01L 21/6715;
(Continued)

(56) References Cited

U.S. PATENT DOCUMENTS 4,697,545 A 10/1987 Guyot
4,780,331 A 10/1988 Cobbs et al.
(Continued)

OTHER PUBLICATIONS

International Preliminary Report on Patentability issued in corresponding International Application PCT/US2011/067488.
International Search Report issued for PCT/US11/67488.

*Primary Examiner* — Frederick B Hargrove
(74) *Attorney, Agent, or Firm* — Juneau & Mitchell; Todd L. Juneau (57) ABSTRACT

Disclosed herein, in certain embodiments, is a method of depositing a polymer onto a surface. In some embodiments, the method comprises using a high electric field and a high frequency vibratory motion to deposit a polymer solution onto the surface.
Disclosed herein, in certain embodiments, is a method of manufacturing an electrode or diode. In some embodiments, the method comprises using a high electric field and a high frequency vibratory motion to deposit a polymer onto a surface.
Further disclosed herein, in certain instances, is an electrode manufactured by any method disclosed herein. Further disclosed herein, in certain instances, is a diode manufactured by any method disclosed herein.

16 Claims, 7 Drawing Sheets (51) Int. Cl.
*H01L 31/0224* (2006.01)
*H01L 31/18* (2006.01)
*B05D 3/12* (2006.01)
*B05D 1/04* (2006.01)

(52) U.S. Cl.
CPC ............ *H01L 51/0005* (2013.01); *B05D 1/04* (2013.01); *B05D 3/12* (2013.01); *Y02E 10/549* (2013.01); *Y02P 70/521* (2015.11)

(58) Field of Classification Search
CPC ....... B05B 5/0255; B05B 5/005; B05B 5/025; B05B 5/032
USPC ...................................... 427/8, 457
See application file for complete search history.

(56) References Cited

U.S. PATENT DOCUMENTS

| | | | |
|---|---|---|---|
| 6,551,765 B1 | 4/2003 | Mukai et al. | |
| 2002/0172829 A1* | 11/2002 | Mori et al. | 428/407 |
| 2003/0157266 A1* | 8/2003 | Spellane | 427/457 |
| 2006/0142514 A1* | 6/2006 | Chandler et al. | 526/247 |
| 2007/0254091 A1* | 11/2007 | Fredrickson | A61L 27/34 427/2.24 |
| 2008/0093217 A1* | 4/2008 | Wu et al. | 204/450 |
| 2008/0118629 A1* | 5/2008 | Shimoda et al. | 427/8 |
| 2009/0032107 A1* | 2/2009 | Kim et al. | 136/263 |
| 2009/0230222 A1* | 9/2009 | Kim et al. | 239/690.1 |
| 2010/0155496 A1* | 6/2010 | Stark et al. | 239/3 |

* cited by examiner

METHODS OF APPLYING POLYMERS TO SURFACES AND SURFACES COATED BY POLYMERS

STATEMENT AS TO FEDERALLY SPONSORED RESEARCH

This invention was not made with the support of the United States government.

BACKGROUND OF THE INVENTION

Solar energy is abundantly available in the environment and photovoltaic cells are the main devices to convert solar energy into electricity. In the US, about 6% of total energy is provided by renewable sources, of which only 6% is attributable to solar cells. Organic Light Emitting Diodes (OLEDs) are on the cutting edge of next-generation technology for electronic displays and general lighting.

In general, the majority of existing technologies for polymer coating PV cells and OLEDs electrodes depend on thin film spin coating technologies. The major functional requirement of polymer coating for applications in photovoltaic cells and OLEDs is the ability to allow uniform conduction through the polymer layer. The invention uses a vibratory motion to generate a localized spreading, and thinning behavior of very small fluid droplets via fluid viscous forces. Moreover, the combined application of a heating and a vibratory motion to enhance nano-scale polymer coat formability.

SUMMARY OF THE INVENTION

Disclosed herein, in certain embodiments, is a method of depositing a polymer onto a surface. In some embodiments, the method comprises using a high electric field and a high frequency vibratory motion to deposit a polymer solution onto the surface.

Disclosed herein, in certain embodiments, is a method of manufacturing an electrode or diode. In some embodiments, the method comprises using a high electric field and a high frequency vibratory motion to deposit a polymer onto a surface.

Disclosed herein, in certain embodiments, is a method of manufacturing a photovoltaic cell or a light emitting diode. In some embodiments, the method comprises using a high electric field and a high frequency vibratory motion to deposit a polymer onto a surface.

Disclosed herein, in certain embodiments, is a method of coating a conductive liquid. In some embodiments, the conductive liquid comprises embedded materials.

Further disclosed herein, in certain instances, is an electrode manufactured by any method disclosed herein.

Further disclosed herein, in certain instances, is a diode manufactured by any method disclosed herein.

Further disclosed herein, in certain instances, is a photovoltaic cell manufactured by any method disclosed herein.

Further disclosed herein, in certain instances, is an OLED cell manufactured by any method disclosed herein.

Further disclosed herein, in certain instances is a coated conductive liquid manufactured by any method disclosed herein.

In some embodiments, the coated conductive liquids includes PEDOT:PSS (Poly(3,4-ethylenedioxythiophene) poly(styrenesulfonate)). The deposition of a layer of PEDOT:PSS increases the efficiency of PV cells and OLED devices. Further, in some embodiments, the coated conductive liquids include Polyaniline, Polyethylenedioxythiophene (PEDOT), Polyphenylene vinylidene, Polydialkylfluorene, Polythiophene, Polypyrrole, and PEDOT-based high-conductive transparent polymers for anode layer of PV cells and OLED devices.

Further disclosed herein, in certain instances, is a coated photovoltaic polymers manufactured by any method disclosed herein.

Further disclosed herein, in certain instances, is a coated light emitting polymers manufactured by any method disclosed herein.

Further disclosed herein, in certain instances, is a chemical sensor manufactured by any method disclosed herein.

In some embodiments, the chemical sensor structure comprises one of more electrode layers containing electrically conductive polymers such as Polyaniline, Polyethylenedioxythiophene (PEDOT), Polyphenylene vinylidene, Polydialkylfluorene, Polythiophene, Polypyrrole, etc.

Further disclosed herein, in certain instances, is a ferroelectric polymer-based sensor manufactured by any method disclosed herein. In some embodiments, the ferroelectric polymer-based sensor structure comprises one of more layers containing crystalline polar polymers such as polyvinylidene fluoride (PVDF) and its co-polymers.

Further disclosed herein, in certain instances, is a thin fluoropolymer-coated device manufactured by any method disclosed herein. In some embodiments, the fluoropolymer-coated device structure comprises one of more layers containing thin fluoropolymer film data Teflon FEP, Teflon PFA, Tefzel ETFE, and their co-polymers.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION OF THE INVENTION

Disclosed herein, in certain embodiments, is a method of depositing a polymer onto a surface. In some embodiments, the method comprises using a high electric field and a high frequency vibratory motion to deposit a polymer solution onto the surface.

Disclosed herein, in certain embodiments, is a method of manufacturing an electrode or diode. In some embodiments, the method comprises using a high electric field and a high frequency vibratory motion to deposit a polymer onto a surface.

Disclosed herein, in certain embodiments, is a method of manufacturing a photovoltaic cell or a light emitting diode. In some embodiments, the method comprises using a high electric field and a high frequency vibratory motion to deposit a polymer onto a surface.

Disclosed herein, in certain embodiments, is a method of coating a conductive liquid. In some embodiments, the conductive liquid comprises embedded materials.

Further disclosed herein, in certain instances, is an electrode manufactured by any method disclosed herein.

Further disclosed herein, in certain instances, is a diode manufactured by any method disclosed herein.

Further disclosed herein, in certain instances, is a photovoltaic, cell manufactured by any method disclosed herein.

Further disclosed herein, in certain instances, is an OLED cell manufactured by any method disclosed herein.

Further disclosed herein, in certain instances, is a coated conductive liquid manufactured by any method disclosed herein.

In some embodiments, the coated conductive liquids includes PEDOT:PSS (Poly(3,4-ethylenedioxythiophene) poly(styrenesulfonate)). The deposition of a layer of PEDOT:PSS increases the efficiency of PV cells and OLED devices. Further, in some embodiments, the coated, conductive liquids include Polyaniline, Polyethylenedioxythiophene (PEDOT), Polyphenylene vinylidene, Polydialkylfluorene, Polythiophene, Polypyrrole, and PEDOT-based high-conductive transparent polymers for anode layer of PV cells and OLED devices.

Further disclosed herein, in certain instances, is a chemical sensor manufactured by any method disclosed herein. In some embodiments, the chemical sensor structure comprises one of more electrode layers containing electrically conductive polymers such as Polyaniline, Polyethylenedioxythiophene (PEDOT), Polyphenylene vinylidene, Polydialkylfluorene, Polythiophene, Polypyrrole, etc.

Further disclosed herein, in certain instances, is a ferroelectric polymer-based sensor manufactured by any method disclosed herein. In some embodiments, the ferroelectric polymer-based sensor structure comprises one of more layers containing crystalline polar polymers such as polyvinylidene fluoride (PVDF) and its co-polymers.

Further disclosed herein, in certain instances, is a thin fluoropolymer-coated device manufactured by any method disclosed herein. In some embodiments, the fluoropolymer-coated device structure comprises one of more layers containing thin fluoropolymer film data Teflon FEP, Teflon PEA, Tefzel ETFE, and their co-polymers.

I. Electrostatic Coating

Current Technology

Current methods of depositing thin, uniform layers of polymers onto a surface utilize spin coating technology. As used herein, "spin coating" means a procedure used to apply uniform thin films to flat substrates. In certain instances, an excess amount of a solution is placed on a surface, which is then rotated at high speed in order to spread the fluid by centrifugal force. Rotation is continued while the fluid spins off the edges of the substrate, until the desired thickness of the film is achieved. Unfortunately, the use of a spinner machine limits the ability to mass produce electrodes, diodes, photovoltaic cells, and light emitting diodes.

Electrostatic Deposition of Polymers

Disclosed herein, in certain embodiments, is a method of depositing a polymer onto a surface. In some embodiments, the method comprises generation of a high electric field based on the use of high voltages (i.e., a field of about 10 KV to about 30 KV) around the surface. In some embodiments, the method further comprises application of a high-frequency vibratory motion (~100-10000 Hz) to the surface. In some embodiments, the method comprises generation of a high electric field around the surface and application of a high-frequency vibratory motion to the surface.

In some embodiments, a single- or multi-degree-of-freedom (DOF) vibrator is used, to produce vibration for generating the effect of spreading the fluid of polymer droplets.

In some embodiments, a surface to be coated is subjected to vibratory motion. In some embodiments, an electric field is generated around the surface to be coated. In some embodiments, a polymer fluid is ejected from at least one nozzle by a high-voltage electrostatic spraying process. In some embodiments, a liquid flow of polymer emerging from the nozzle under the influence of a strong electrostatic field (i.e., a field of about 10 KV to about 30 KV) breaks up into small droplets. In some embodiments, the small droplets of polymer emerge from the nozzle with an electric charge. In some embodiments, the small droplets of polymer are attracted to the oppositely charged and vibrating surface.

In some embodiments, the coating is ultra-thin thickness less than ~10 nm.

In some embodiments, the wetness of the polymer droplets is varied. In some embodiments, the temperature surrounding the surface is controlled to affect a change in wetness.

In some embodiments, the electrostatic coating process is repeated. In some embodiments, a first coating is applied to the surface. In some embodiments, the first coating is allowed to dry. In some embodiments, a second coating is then applied to the surface. Any number of multiple coatings is envisioned. The application, of two coatings is merely exemplary and is not intended to be limiting. In some embodiments, the temperature surrounding the surface is varied to control the drying process (e.g., drying time).

In some embodiments, the method is utilized with one dimensional surfaces. In some embodiments the method is utilized with two dimensional surfaces (e.g., electrodes and diodes). In some embodiments, the method is utilized with three dimensional surfaces (e.g., electrodes and diodes).

Benefits of Electrostatic Coating

A major benefit electrostatic coating of polymers is that it enables mass production of electrodes, diodes, solar cells, and light emitting diodes. In some embodiments, electrostatic coating enables roll to roll production of electrodes, diodes, solar cells, and light emitting diodes. As used herein, "roll to roll" means the process of creating electronic devices on a roll of flexible plastic or metal foil.

Further, electrostatic coating of polymers reduces the costs associated with manufacturing of electrodes, diodes, solar cells, and light emitting diodes.

In some embodiments, generating a high electric field around the surface and applying a high-frequency vibratory motion to the surface results in a repeatable polymer deposition process.

In some embodiments, generating a high electric field around the surface and applying a high-frequency vibratory motion to the surface creates effective fluid viscous forces that result in the localized spreading of the polymer. In some embodiments, the high-frequency vibratory motion of the surface enhances the surface roughness of the deposited polymer and the uniformity of the polymer thickness.

In some embodiments, the use of a high electric field generates micro/nano-scale polymer coatings.

II. Manufacturing of Electrodes

A. Patterning of the Electrode

Disclosed herein, in certain embodiments, is a method of manufacturing a three-dimensional electrode comprising: patterning a conductive or semi-conductive material into the desired three-dimensional shape; and heating the patterned conductive or semi-conductive material. In some embodiments, the electrode is made from a polymer precursor. In some embodiments, the electrode is a made from a powder precursor that is consolidated or partially consolidated. In some embodiments, the electrode is made from carbon or a carbon allotrope.

In some embodiments, the patterning process is any polymer 3D shaping process. In some embodiments, the patterning process is any powder 3D shaping process. In some embodiments, the patterning process is stamping, extrusion, printing, lithography, rolling, or combinations thereof. In some embodiments, the patterning process is ink-jet printing. In some embodiments, the patterning process is stamping. In some embodiments, the patterning process is roll-to-roll. In some embodiments, the patterning process is photolithography.

In some embodiments, the electrodes are manufactured by first patterning a conductive powder or polymer. In some embodiments, the patterning consists of two layers. In some embodiments, the bottom layer is for the wire traces that connect a series of anodes and cathodes separately. In some embodiments, the sec mid layer consists of the high-aspect ratio electrodes.

B. Heating

In some embodiments, the patterning process is followed by heating. In some embodiments, the heating is earned out by sintering, pyrolysis, or baking.

In some embodiments, the patterned polymer or powder is subjected to heating (e.g., sintering, pyrolysis, or baking). As used herein, "sintering" means heating a powder below its melting point until the powder particles adhere to each other. As used herein, "pyrolysis" means chemical decomposition of a condensed substance by heating.

Sintering

In some embodiments, the polymer is a powder and the heating is carried out by sintering. In some embodiments, sintering results in the powder particles adhering to one another to form a single object. In some embodiments, the sintering comprises the application of heat and pressure to a patterned powder. In some embodiments, the sintering comprises Joule heating and pressure to a patterned powder. In some embodiments, sequential layers of powders are deposited in-situ following each sintering path.

In some embodiments, the sintering is spark-plasma sintering (SPS). In some embodiments, the SPS is administered through a tip. In some embodiments, the tip is at least 1 nm. In some embodiments, the tip is greater than 1 nm. In some embodiments, when there is a small contact area between the tip and the powder bed, the electric current requirement is low. In some embodiments, SPS enables the sintering of nano-powders (and the retention of the nanostructure), micro-powders and the retention of the microstructure), or macro-powders at low temperatures, in a short amount of time while using much higher heating rates than conventionally possible. In some embodiments, SPS enables shape and size of the electrode to be controlled by controlling the tip size, position, path and speed.

The effect of an electric field on the diffusion flux ($J_i$) in accordance with electromigration theory is detailed in the following equation:

$$J_i = -\frac{D_i C_i}{RT}\left[\frac{RT \partial \ln C_i}{\partial x} + F z^* E\right]$$

where $D_i$ is the diffusion coefficient, $C_i$ is concentration, F is Faraday's Constant, $z^*$ is the effective charge on diffusing species, T is the temperature, E is the field and R is the gas constant.

Pyrolysis

In some embodiments, the heating is carried out by pyrolysis. In some embodiments, pyrolysis occurs under pressure, with no or minimal oxygen (e.g., less than stoichiometric quantities of oxygen), and at operating temperatures above 430° C. In some embodiments, organic materials are transformed into gases, small quantities of liquid, and a solid residue (coke) containing fixed carbon and ash. In some embodiments, pyrolysis occurs in any suitable device (e.g., a rotary kiln, rotary hearth furnace, or fluidized bed furnace).

C. Application of Conductive Polymers

In some embodiments, once the electrode is manufactured, a conductive polymer (e.g., poly(3,4-ethylenedioxythiophene)poly(styrenesulfonate) or PEDOT:PSS) is deposited on the surface of the electrode.

In some embodiments, depositing a conductive polymer on an electrode requires scoring the electrode surface. In some embodiments, dry gas etching is used to create rough surfaces on the carbon electrodes.

Polymers

In some embodiments, the conductive polymer is PEDOT:PSS.

In, some embodiments, conductive polymers are Polyaniline, Polyethylenedioxythiophene (PEDOT), Polyphenylene vinylidene, Polydialkylfluorene, Polythiophene, Polypyrrole, etc.

Electrostatic Coating Technique

Disclosed herein, in certain embodiments, is a method of depositing a polymer onto a surface. In some embodiments, the method comprises generation of a high electric field around the surface. In some embodiments, the method further comprises application of a high-frequency vibratory motion to the surface. In some embodiments, the method comprises generation of a high electric field around the surface and application of a high-frequency vibratory motion to the surface.

In some embodiments, generating a high electric field around the surface and applying a high-frequency vibratory motion to the surface results in a repeatable polymer deposition process.

In some embodiments, generating a high electric field around the surface and applying a high-frequency vibratory motion to the surface results in thinning behavior of small polymer droplets. In some embodiments, the small polymer droplets are generated by a high-voltage electrostatic spraying process. In some embodiments, a liquid flow of polymer emerging from a tip or thin tube under the influence of a strong electrostatic field (i.e., a field of about 10 KV to about 30 KV) will break up into small droplets. In some embodiments, the small droplets of polymer emerge from the tip or thin tube with an electric charge. In some embodiments, the small droplets of polymer are attracted to the oppositely charged and vibrating surface.

In some embodiments, generating a high electric field around the surface and applying a high-frequency vibratory motion to the surface creates effective fluid viscous forces that result in the localized spreading of the polymer. In some embodiments, the high-frequency vibratory motion of the surface enhances the surface roughness of the deposited polymer and the uniformity of the polymer thickness.

In some embodiments, the wetness of the polymer droplets is varied. In some embodiments, the temperature surrounding the surface is controlled to affect a change in wetness.

In some embodiments, the electrostatic coating process is repeated. In some embodiments, a first coating is applied to the surface. In some embodiments, the first coating is allowed to dry. In some embodiments, a second coating is then applied to the surface. Any number of multiple coatings is envisioned. The application of two coatings is merely exemplary and is not intended to be limiting. In some embodiments, the temperature surrounding the surface is varied to control the drying process (e.g., drying time).

D. Further Processing

In some embodiments, deposition of the conductive polymer is followed by photolithography to remove all conductive polymer from all regions except in the vicinity (1-2 micron) of the desired electrode.

III. Photovoltaic Cells

Photovoltaic cells typically consist of a thin photoactive layer (e.g., about 100 nanometers) that is sandwiched between or surrounds two electrodes (an anode and a cathode).

In some embodiments, the anode is a transparent, conductive metal oxide (e.g., Indium Tin Oxide). In some embodiments, the cathode is aluminum. In some embodiments, an electrode is an all-polymer electrode. In some embodiments, an electrode comprises carbon, a carbon allotrope, or an organic polymer. In some embodiments, an electrode comprises graphite or glassy carbon.

In some embodiments, an electrode is transparent and does not interfere with the ability of electromagnetic radiation to reach the photoactive materials.

A. Patterning of the Electrode

Disclosed herein, in certain embodiments, is a method of manufacturing a three-dimensional electrode comprising: patterning a conductive or semi-conductive material into the desired three-dimensional shape; and heating the patterned conductive or semi-conductive material. In some embodiments, the electrode is made from a polymer precursor. In some embodiments, the electrode is a made from a powder precursor that is consolidated or partially consolidated. In some embodiments, the electrode is made from carbon or a carbon allotrope.

In some embodiments, the patterning process is any polymer 3D shaping process. In some embodiments, the patterning process is any powder 3D shaping process. In some embodiments, the patterning process is stamping, extrusion, printing, lithography, rolling, or combinations thereof. In some embodiments, the patterning process is ink jet printing. In some embodiments, the patterning process is stamping. In some embodiments, the patterning process is roll-to-roll. In some embodiments, the patterning process is photolithography.

In some embodiments, the electrodes are manufactured by first patterning a conductive powder or polymer. In some embodiments, the patterning consists of two layers. In some embodiments the bottom layer is for the wire traces that connect a series of anodes and cathodes separately. In some embodiments, the second layer consists of the high-aspect ratio electrodes.

B. Heating of the Electrodes

In some embodiments, the patterning process is followed by heating. In some embodiments, the heating is carried out by sintering, pyrolysis, or baking.

In some embodiments, the patterned polymer or powder is subjected to heating (e.g., sintering, pyrolysis, or baking). As used herein, "sintering" means heating a powder below its melting point until the powder particles adhere to each other. As used herein, "pyrolysis" means chemical decomposition of a condensed substance by heating.

Sintering

In some embodiments, the polymer is a powder and the heating is carried out by sintering. In some embodiments, sintering results in the powder particles adhering to one another to form a single object. In some embodiments, the sintering comprises the application of heat and pressure to a patterned powder. In some embodiments, the sintering comprises Joule heating and pressure to a patterned powder. In some embodiments, sequential layers of powders are deposited in-situ following each sintering path.

In some embodiments, the sintering is spark-plasma sintering (SPS). In some embodiments, the SPS is administered through a tip. In some embodiments, the tip is at least 1 nm. In some embodiments, the tip is greater than 1 nm. In some embodiments, when there is a small contact area between the tip and the powder bed, the electric current requirement is low. In some embodiments, SPS enables the sintering of nano-powders (and the retention of the nanostructure), micro-powders (and the retention of the microstructure), or macro-powders at low temperatures, in a short amount of time while using much higher heating rates than conventionally possible. In some embodiments, SPS enables shape and size of the electrode to be controlled by controlling the tip size, position, path and speed.

The effect of an electric field on the diffusion flux ($J_i$) in accordance with electromigration theory is detailed in the following equation:

$$J_i = -\frac{D_i C_i}{RT}\left[\frac{RT \partial \ln C_i}{\partial x} + Fz^* E\right]$$

where $D_i$ is the diffusion coefficient, $C_i$ is concentration, F is Faraday's Constant, z* is the effective charge on diffusing species, T is the temperature, E is the field and R is the gas constant.

Pyrolysis

In some embodiments, the heating is carried out by pyrolysis. In some embodiments, pyrolysis occurs under pressure, with no or minimal oxygen (e.g., less than stoichiometric quantities of oxygen), and at operating temperatures above 430° C. In some embodiments, organic materials are transformed into gases, small quantities of liquid, and a solid residue (coke) containing fixed carbon and ash. In some embodiments, pyrolysis occurs in any suitable device (e.g., a rotary kiln, rotary hearth furnace, or fluidized bed furnace).

C. Application of Conductive Polymers to Anodes

In some embodiments, the anodes are coated with a thin layer of conducting polymer. In some embodiments the anodes are coated with PEDOT:PSS. In some embodiments, the conductive polymer is applied to an anode by electrostatic coating as described herein.

In some embodiments, depositing a conductive polymer on an electrode requires scoring the anode surface. In some embodiments, dry gas etching is used to create rough surfaces on the carbon electrodes.

Polymers

In some embodiments, the conductive polymer is PEDOT:PSS. In some embodiments, conductive polymers are Polyaniline, Polyethylenedioxythiophene (PEDOT), Polyphenylene vinylidene, Polydialkylfluorene, Polythiophene, Polypyrrole, etc.

Electrostatic Coating Technique

Disclosed herein, in certain embodiments, is a method of depositing a polymer onto an anode. In some embodiments, the method comprises generation of a high electric field around the anode. In some embodiments, the method further comprises application of a high-frequency vibratory motion to the anode. In some embodiments, the method comprises generation of a high electric field around the anode and application of a high-frequency vibratory motion to the anode.

In some embodiments, generating a high electric field around the anode and applying a high-frequency vibratory motion to the anode results in a repeatable polymer deposition process.

In some embodiments, generating a high electric field around the anode and applying a high-frequency vibratory motion to the anode results in thinning behavior of small polymer droplets. In some embodiments, the small polymer droplets are generated by a high-voltage electrostatic spraying process. In some embodiments, a liquid flow of polymer emerging from a tip or thin tube under the influence of a strong electrostatic field (i.e., a field of about 10 KV to about 30 KV) will break up into small droplets. In some embodiments, the small droplets of polymer emerge from the tip or thin tube with an electric charge. In some embodiments, the small droplets of polymer are attracted to the oppositely charged and vibrating anode.

In some embodiments, generating a high electric field around the anode and applying a high-frequency vibratory motion to the anode creates effective fluid viscous forces that result in the localized spreading of the polymer. In some embodiments, the high-frequency vibratory motion of the anode enhances the anode roughness of the deposited polymer and the uniformity of the polymer thickness.

In some embodiments, the wetness of the polymer droplets is varied. In some embodiments, the temperature surrounding the anode is controlled to affect a change in wetness.

In some embodiments, the electrostatic coating process is repeated. In some embodiments, a first coating is applied to the anode. In some embodiments, the first coating is allowed to dry. In some embodiments, a second coating is then applied to the anode. Any number of multiple coatings is envisioned. The application of two coatings is merely exemplary and is not intended to be limiting. In some embodiments, the temperature surrounding the anode is varied to control the drying process (e.g., drying, time).

D. Further Processing of the Electrodes

In some embodiments, deposition of the conductive polymer is followed by photolithography to remove all conductive polymer from all regions except in the vicinity (1-2 micron) of the desired electrode.

E. Photoactive Material

In some embodiments, a photoactive material surrounds the first electrode and the second electrode.

In some embodiments, the first photoactive material comprises a matrix of heterojunction photoactive material. In some embodiments, the first photoactive material comprises crystalline silicone, cadmium telluride, copper-indium selenide, copper indium/gallium diselenide, ruthenium metalorganic dye, P3HT (poly(3-hexylthiophene)), PCBM (phenyl-C61-butyric acid methyl ester), or combinations thereof. In some embodiments, the photoactive material comprises P3HT (poly(3-hexylthiophene)) and PCBM (phenyl-C61-butyric acid methyl ester). In some embodiments, the photoactive material comprises P3HT (poly(3-hexylthiophene)) and PCBM (phenyl-C61-butyric acid methyl ester) in a 1:1 ratio by weight. In some embodiments, the photoactive material comprises p-phenylene-vinylene (PPV) based mixtures of conjugated polymers such as MEH-PPV, CN-PPV, MDMO-PPV, etc. In some embodiments, the photoactive material comprises a conjugated polymer/fullerene mixture.

In some embodiments, the photovoltaic cells comprise multiple photoactive layers. In some embodiments, the cell further comprises, a second photoactive material; and wherein the absorption spectrum of the first photoactive material and the absorption of the second photoactive material are different. In some embodiments, the use of multiple photoactive layers enables increased absorption of photonic energy and hence increased efficiency. In certain instances, visible light tends to have an average of 51% of photon energy whereas infrared (IR) could have as much as 45% of photon energy. Thus, in some embodiments, the introduction of a varying depth of photoactive region will enable the harvesting of more bandwidth in the spectrum.

F. Patterns of the Electrodes on the Wafer, Metal or Non-Metal Substrate, Sheet or Film In some embodiments, the first electrode and the second electrode are arranged in a plain structure.

In some embodiments, the first electrode and the second electrode are arranged in a grouped pattern.

In some embodiments, the first electrode and the second electrode are arranged in a separated pattern.

In some embodiments, the electrodes are formed in a no trace architecture. In some embodiments, the diodes is formed with a trace architecture. As used herein, "trace", means the equivalent of a wire for conducting signals. In some embodiments, a trace consists of a flat, narrow part of the copper foil that remains after etching.

In some embodiments, the cell has a single layer of photoactive material and no trace pattern. In some embodiments, the cell has a single layer of photoactive material and a separated pattern. In some embodiments, the cell has a single layer of photoactive material and a grouped pattern.

In some embodiments, the cell has more than one layer of photoactive material and no trace pattern. In some embodiments, the cell has more than one layer of photoactive material and a separated pattern. In some embodiments, the chip has more than one layer of photoactive material and a grouped pattern.

G. Transparent Material

In some embodiments, the photovoltaic cell is surrounded by a transparent material, wherein the transparent material protects the cell from oxidation. In some embodiments, the photovoltaic cell is surrounded by a transparent material of glass, plastic, ceramic or a combination thereof. In some embodiments, the photovoltaic cell is surrounded by a transparent material of glass, wherein the glass protects the cell from oxidation. In some embodiments, the photovoltaic cell is surrounded by a transparent material of plastic, wherein the glass protects the cell from oxidation.

H. Uses

In some embodiments, the cell is used to make a solar module. As used herein, a "solar module" means an interconnected assembly of solar cells.

IV. Diodes

A. Patterning of Diodes

In some embodiments, the diodes are manufactured by first patterning a conductive powder or polymer. In some embodiments, the patterning consists of two layers.

In some embodiments, the bottom layer is for the wire traces that connect a series of diode. In some embodiments, the second layer consists of the high-aspect ratio diodes.

In some embodiments, the patterning process is any polymer 3D shaping process. In some embodiments, the patterning process is any powder 3D shaping process. In some embodiments, the patterning process is stamping, extrusion, printing, lithography, rolling, or combinations thereof. In some embodiments, the patterning process is ink-jet printing. In some embodiments, the patterning process is stamping. In some embodiments, the patterning process is roll-to-roll. In some embodiments, the patterning process is photolithography.

Materials

In some embodiments, the diodes comprise a conductive or semi-conductive or semi-conductive material. In some embodiments, the diodes comprise a conductive or semi-conductive material selected from: carbon, a carbon allotrope, or an organic polymer. In some embodiments, the diodes comprise a conductive or semi-conductive material selected from graphite, diamond, amorphous carbon, buckminsterfullerenes, glassy carbon, carbon nanofoam, lonsdaleite, linear acetylenic carbon, or combinations thereof. In some embodiments, the diode comprises graphite. In some embodiments, the diode comprises glassy carbon. As opposed to conventional metal diodes, such as aluminum and indium tin oxide, carbon-based diodes are cheaper to manufacture. Carbon is abundantly availability—it is the fourth most abundant element on earth. Indium tin oxide is very scarce with world-wide supply projected to last only 10 years. Further, an expensive process is required to obtain a good quality ITO. Additionally, carbon has excellent electrochemical stability, and good thermal and electrical conductivities.

In some embodiments, the diodes comprise a conductive or semi-conductive material selected from: a metal, a metal alloy, an intermetallic material, a metallic glass, a composite material, a polymer, biocompatible material, or combinations thereof. In some embodiments, the diodes comprise SU-8 negative photoresist. In some embodiments, the diode comprises a metal. In some embodiments, the diode comprises a metal alloy. In some embodiments, the diode comprises an intermetallic. In some embodiments, the diode comprises a metallic glass. In some embodiments, the diode comprises a composite material. In some embodiment, the diode comprises a biocompatible material. In some embodiments, the diode comprises a semiconductor, a superconductor, or a combination thereof.

B. Heating of the Diodes

In some embodiments, the patterning process is followed by heating. In some embodiments, the heating is carried out by sintering, pyrolysis, or baking.

In some embodiments, the patterned polymer or powder is subjected to heating (e.g., sintering, pyrolysis, or baking). As used herein, "sintering" means heating a powder below its melting point until the powder particles adhere to each other. As used herein, "pyrolysis" means chemical decomposition of a condensed substance by heating.

Sintering

In some embodiments, the polymer is a powder and the heating is carried out by sintering. In some embodiments, sintering results in the powder particles adhering to one another to form a single object. In some embodiments, the sintering comprises the application of heat and pressure to a patterned powder. In some embodiments, the sintering comprises Joule heating and pressure to a patterned powder. In some embodiments, sequential layers of powders are deposited in-situ following each sintering path.

In some embodiments, the sintering is spark-plasma sintering (SPS). In some embodiments, the SPS is administered through a tip. In some embodiments, the tip is at least 1 nm. In some embodiments, the tip is greater than 1 nm. In some embodiments, when there is a small contact area between the tip and the powder bed, the electric current requirement is low. In some embodiments, SPS enables the sintering of nano-powders (and the retention of the nanostructure), micro-powders (and the retention of the microstructure), or macro-powders at low temperatures, in a short amount of time while using much higher heating rates than conventionally possible. In some embodiments, SPS enables shape and size of the electrode to be controlled by controlling the tip size, position, path and speed.

The effect of an electric field on the diffusion flux ($J_i$) in accordance with electromigration theory is detailed in the following equation:

$$J_i = -\frac{D_i C_i}{RT}\left[\frac{RT \partial \ln C_i}{\partial x} + Fz^* E\right]$$

where $D_i$ is the diffusion coefficient, $C_i$ is concentration, F is Faraday's Constant, $z^*$ is the effective charge on diffusing species. T is the temperature, E is the field and R is the gas constant.

Pyrolysis

In some embodiments, the heating is carried out by pyrolysis. In some embodiments, pyrolysis occurs under pressure, with no or minimal oxygen (e.g., less than stoichiometric quantities of oxygen), and at operating temperatures above 430° C. In some embodiments, organic materials are transformed into gases, small quantities of liquid, and a solid residue (coke) containing fixed carbon and ash. In some embodiments, pyrolysis occurs in any suitable device (e.g., a rotary kiln, rotary hearth furnace, or fluidized bed furnace).

C. Application of Conductive Polymers to Diodes

In some embodiments, the diodes are coated with a thin layer of conducting polymer. In some embodiments, the diodes are coated with PEDOT:PSS. In some embodiments, the conductive polymer is applied to a diode by electrostatic coating as described herein.

In some embodiments, depositing a conductive polymer on an electrode requires scoring the diode surface. In some embodiments, dry gas etching is used to create rough surfaces on the carbon electrodes.

Polymers

In some embodiments, the conductive polymer is PEDOT:PSS. In some embodiments, the conductive polymer is Polyaniline, Polyethylenedioxythiophene (PEDOT), Polyphenylene vinylidene, Polydialkylfluorene, Polythiophene, Polypyrrole, etc.

Electrostatic Coating Technique

Disclosed herein, in certain embodiments, is a method of depositing a polymer onto a diode. In some embodiments, the method comprises generation of a high electric field around the diode. In some embodiments, the method further comprises application of a high-frequency vibratory motion to the diode. In some embodiments, the method comprises generation of a high electric field around the diode and application of a high-frequency vibratory motion to the diode.

In some embodiments, generating a high electric field around the diode and applying a high-frequency vibratory motion to the diode results in a repeatable polymer deposition process.

In some embodiments, generating a high electric field around the diode and applying a high-frequency vibratory motion to the diode results in thinning behavior of small polymer droplets. In some embodiments, the small polymer droplets are generated by a high-voltage electrostatic spraying process. In some embodiments, a liquid flow of polymer emerging from a tip or thin tube under the influence of a strong electrostatic field (i.e., a field of about 10 KV to about 30 KV) will break up into small droplets. In some embodiments, the small droplets of polymer emerge from the tip or thin tube with an electric charge. In some embodiments, the small droplets of polymer are attracted to the oppositely charged and vibrating diode.

In some embodiments, generating a high electric field around the diode and applying a high-frequency vibratory motion to the diode creates effective fluid viscous forces that result in the localized spreading of the polymer. In some embodiments, the high-frequency vibratory motion of the diode enhances the diode roughness of the deposited polymer and the uniformity of the polymer thickness.

In some embodiments, the wetness of the polymer droplets is varied. In some embodiments, the temperature surrounding the diode is controlled to affect a change in wetness.

In some embodiments, the electrostatic coating process is repeated. In some embodiments, a first coating is applied to the diode. In some embodiments, the first coating is allowed to dry. In some embodiments, a second coating is then applied to the diode. Any number of multiple coatings is envisioned. The application of two coatings is merely exemplary and is not intended to be limiting. In some embodiments, the temperature surrounding the diode is varied to control the drying process (e.g., drying time).

D. Further Processing of the Electrodes

In some embodiments, deposition of the conductive polymer is followed by photolithography to remove all conductive polymer from all regions except in the vicinity (1-2 micron) of the desired electrode.

V. LED Cells

Disclosed herein, in certain embodiments, is an electroluminescent cell manufactured by a method disclosed herein. In some embodiments, the cell is an organic LED. In some embodiments, the diode is transparent.

A. Patterning of the Diode

Disclosed herein, in certain embodiments, is a method of manufacturing a three-dimensional diode comprising: patterning a conductive or semi-conductive material into the desired three-dimensional shape; and heating the patterned conductive or semi-conductive material. In some embodiments, the diode is made from a polymer precursor. In some embodiments, the diode is a made from a powder precursor that is consolidated or partially consolidated. In some embodiments, the diode is made from carbon or a carbon allotrope.

In some embodiments, the patterning process is any polymer 3D shaping process. In some embodiments, the patterning process is any powder 3D shaping process. In some embodiments, the patterning process is stamping, extrusion, printing, lithography, rolling, or combinations thereof. In some embodiments, the patterning process is ink-jet printing. In some embodiments, the patterning process is stamping. In some embodiments, the patterning process is roll-to-roll. In some embodiments, the patterning process is photolithography.

In some embodiments, the diodes are manufactured by first patterning a conductive powder or polymer. In some embodiments, the patterning consists of two layers. In some embodiments the bottom layer is for the wire traces that connect a series of anodes and cathodes separately. In some embodiments, the second layer consists of the high-aspect ratio diodes.

In some embodiments, the diode is an all-polymer electrode. In some embodiments, the diode comprises carbon, a carbon allotrope, or an organic polymer. In some embodiments, the diode comprises graphite or glassy carbon.

In some embodiments, the sizes of individual 3D diodes are from a few nanometers to several mm. In some embodiments, the spacing between diodes is from a few nanometers to several mm.

B. Heating of the Diodes

In some embodiments, the patterning process is followed by heating. In some embodiments, the heating is carried out by sintering, pyrolysis, or baking.

In some embodiments, the patterned polymer or powder is subjected to heating (e.g., sintering, pyrolysis, or baking). As used herein, "sintering" means heating a powder below its melting point until the powder particles adhere to each other. As used herein, "pyrolysis" means chemical decomposition of a condensed substance by heating.

Sintering

In some embodiments, the polymer is a powder and the heating is carried out by sintering. In some embodiments, sintering results in the powder particles adhering to one another to form a single object. In some embodiments, the sintering comprises the application of heat and pressure to a patterned powder. In some embodiments, the sintering comprises Joule heating and pressure to a patterned powder. In some embodiments, sequential layers of powders are deposited in-situ following each sintering path.

In some embodiments, the sintering is spark-plasma sintering (SPS). In some embodiments, the SPS is administered through a tip. In some embodiments, the tip is at least 1 nm. In some embodiments, the tip is greater than 1 nm. In some embodiments, when there is a small contact area between the tip and the powder bed, the electric current requirement is low. In some embodiments, SPS enables the sintering of nano-powders (and the retention of the nanostructure), micro-powders (and the retention of the microstructure), or macro-powders at low temperatures, in a short amount of time while using much higher heating rates than conventionally possible. In some embodiments, SPS enables shape and size of the diode to be controlled by controlling the tip size, position, path and speed.

The effect of an electric field on the diffusion flux ($J_i$) in accordance with electromigration theory is detailed in the following equation:

$$J_i = -\frac{D_i C_i}{RT}\left[\frac{RT \partial \ln C_i}{\partial x} + F z^* E\right]$$

where $D_i$ is the diffusion coefficient, $C_i$ is concentration, F is Faraday's Constant, z* is the effective charge on diffusing species, T is the temperature, E is the field and R is the gas constant.

Pyrolysis

In some embodiments, the heating is carried out by pyrolysis. In some embodiments, pyrolysis occurs under pressure, with no or minimal oxygen (e.g., less than stoichiometric quantities of oxygen), and at operating temperatures above 430° C. In some embodiments, organic materials are transformed into gases, small quantities of liquid, and a solid residue (coke) containing fixed carbon and ash. In some embodiments, pyrolysis occurs in any suitable device (e.g., a rotary kiln, rotary hearth furnace, or fluidized bed furnace).

C. Application of Conductive Polymers to Diodes

In some embodiments, the diodes are coated with a thin layer of conducting polymer. In some embodiments, the diodes are coated with PEDOT:PSS. In some embodiments, the conductive polymer is applied to a diode by electrostatic coating as described herein.

In some embodiments, depositing a conductive polymer on a diode requires scoring the diode surface. In some embodiments, dry gas etching is used to create rough surfaces on the carbon diodes.

Polymers

In some embodiments, the conductive polymer is PEDOT:PSS. In some embodiments, the conductive polymer is Polyaniline, Polyethylenedioxythiophene (PEDOT), Polyphenylene vinylidene, Polydialkylfluorene, Polythiophene, Polypyrrole, etc.

Electrostatic Coating Technique

Disclosed herein, in certain embodiments, is a method of depositing a polymer onto a diode. In some embodiments, the method comprises generation of a high electric field around the diode. In some embodiments, the method further comprises application of a high-frequency vibratory motion to the diode. In some embodiments, the method comprises generation of a high electric field around the diode and application of a high-frequency vibratory motion to the diode.

In some embodiments, generating a high electric field around the diode and applying a high-frequency vibratory motion to the diode results in a repeatable polymer deposition process.

In some embodiments, generating a high electric field around the diode and applying a high-frequency vibratory motion to the diode results in thinning behavior of small polymer droplets. In some embodiments, the small polymer droplets are generated by a high-voltage electrostatic spraying process. In some embodiments, a liquid flow of polymer emerging from a tip or thin tube under the influence of a strong electrostatic field (i.e., a field of about 10 KV to about 30 KV) will break up into small droplets. In some embodiments, the small droplets of polymer emerge from the tip or thin tube with an electric charge. In some embodiments, the small droplets of polymer are attracted to the oppositely charged and vibrating diode.

In some embodiments, generating a high electric field around the diode and applying a high-frequency vibratory motion to the diode creates effective fluid viscous forces that result in the localized spreading of the polymer. In some embodiments, the high-frequency vibratory motion of the diode enhances the diode roughness of the deposited polymer and the uniformity of the polymer thickness.

In some embodiments, the wetness of the polymer droplets is varied. In some embodiments, the temperature surrounding the diode is controlled to affect a change in wetness.

In some embodiments, the electrostatic coating process is repeated. In some embodiments, a first coating is applied to the diode. In some embodiments, the first coating is allowed to dry. In some embodiments, a second coating is then applied to the diode. Any number of multiple coatings is envisioned. The application of two coatings is merely exemplary and is not intended to be limiting. In some embodiments, the temperature surrounding the diode is varied to control the drying process (e.g., drying time).

D. Further Processing of the Diodes

In some embodiments, deposition of the conductive polymer is followed by photolithography to remove all conductive polymer from all regions except in the vicinity, (1-2 micron) of the desired diode.

E. Emissive Electroluminescent Material

In some embodiments, an emissive electroluminescent material surrounds the first diode and the second diode.

In some embodiments, the first emissive electroluminescent material comprises a matrix of light emitting polymer material. In some embodiments, the first photoactive material comprises Cyano-Polyphenylene vinylene (CN-PPV) Polymers, Nitrogen-Containing Polymers, Poly(fluorenylene ehtynylene) (PFE) Polymers, Poly(phenylene ethynylene) (PPE) Polymers, Polyfluorene (PFO) Polymers, Polyfluorene-Vinylene (PFV) Polymers, Polyphenylene Vinylene (PPV) Polymers, Polythiophene Polymers, and Water-Soluble Light-Emitting Polymers.

In some embodiments, the LED cells comprises multiple emissive electroluminescent layers. In some embodiments, the cell farther comprises a second emissive electroluminescent material; and wherein the light wavelength spectrum of the first emissive electroluminescent material and the light wavelength of the second emissive electroluminescent material are different. In some embodiments, the use of multiple emissive electroluminescent layers enables increased emitting photonic energy and hence increased efficiency. In certain instances, the color of visible light will be controlled by varying depth of emissive electroluminescent region.

F. Patterns of the Electrodes on the Wafer Metal or Non-Metal Substrate, Sheet or Film In some embodiments, the cell comprises more than one diode.

In some embodiments, a first electrode and a second diode are arranged in a plain structure.

In some embodiments, a first diode and a diode electrode are arranged in a grouped pattern.

In some embodiments, a first diode and a second diode are arranged in a separated pattern.

In some embodiments, the electrodes are formed in a no trace architecture. In some embodiments, the diodes are formed with a trace architecture. As used herein, "trace", means the equivalent of a wire for conducting signals. In some embodiments, a trace consists of a flat, narrow part of the copper foil that remains after etching.

G. Transparent Material

In some embodiments, the electroluminescent cell is surrounded by a transparent material, wherein the transparent material protects the cell from oxidation. In some embodiments, the electroluminescent cell is surrounded by a transparent material of glass, plastic, ceramic or a combination thereof. In some embodiments, the electroluminescent cell is surrounded by a transparent material of glass, wherein the glass protects the cell from oxidation. In some embodiments, the electroluminescent cell is surrounded by a transparent material of plastic, wherein the glass protects the cell from oxidation.

H. Uses

In some embodiments, the cell is used to make a flexible display, a light source, a wall decoration, or a light-emitting cloth.

EXAMPLES

Example 1

Figure 1:
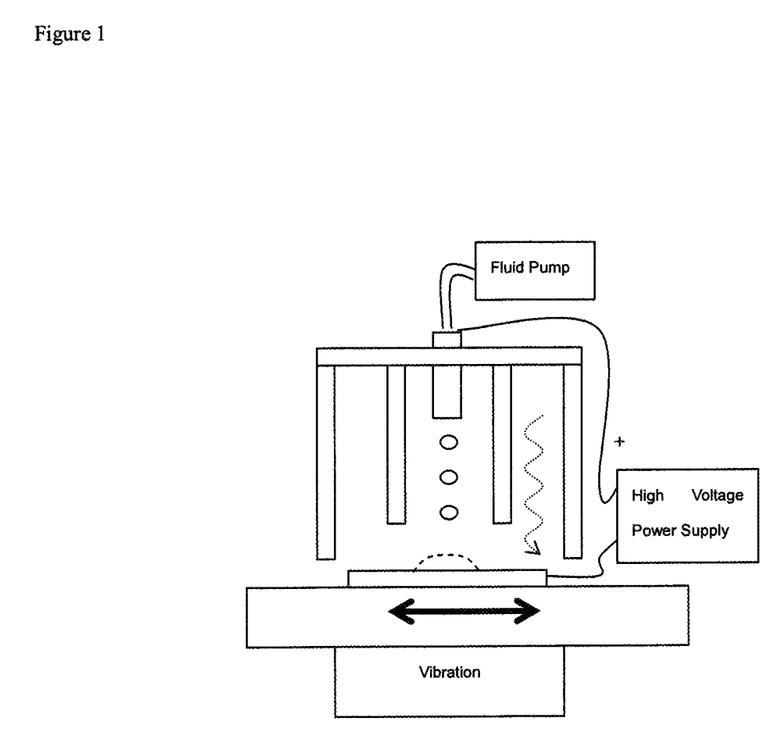
FIG. 1 illustrates the vibratory electrostatic coating process.
Figure 2:
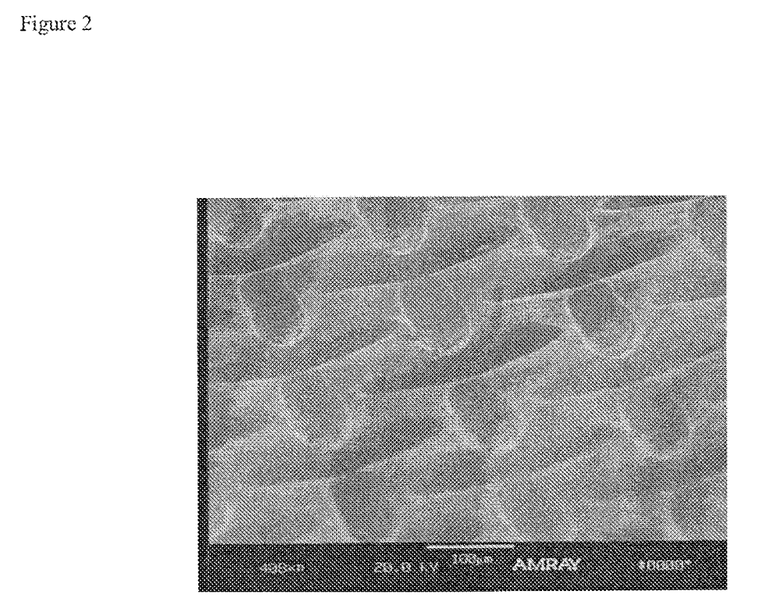
FIG. 2 is a picture of a textured substrate surface coated with a polymer solution.
Figure 3:
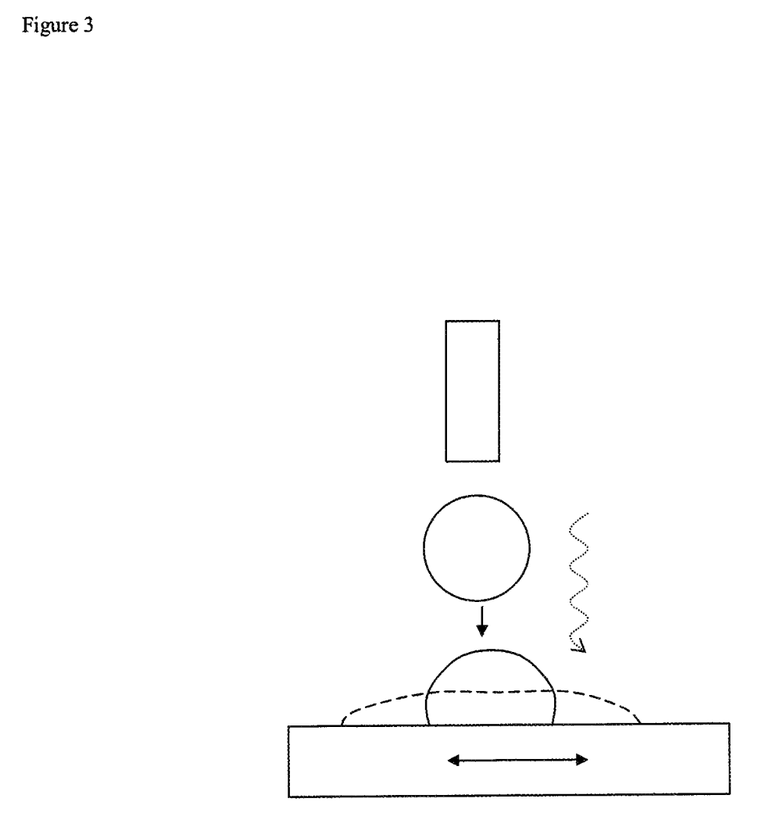
FIG. 3 is a figure of an illustrated surface coating process with a polymer solution.
Figure 4:
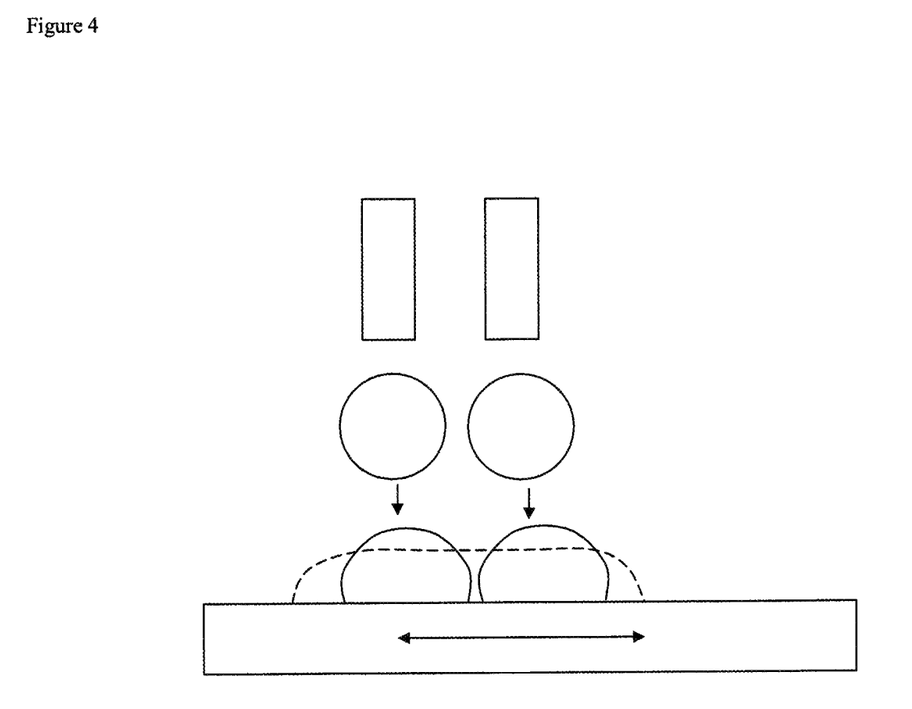
FIG. 4 is illustration of the use of the multiple pumps and nozzles to increases polymer material coating rate during the electrostatic coating process.

In this example, the multiple pumps and nozzles are used to increases polymer material coating rate during the electrostatic coating process as shown in FIG. 4. The combination of liquid pressure, orifice/nozzle-size combination, pump power capacity and electric field increases polymer spraying rate.

Example 2

Figure 5:
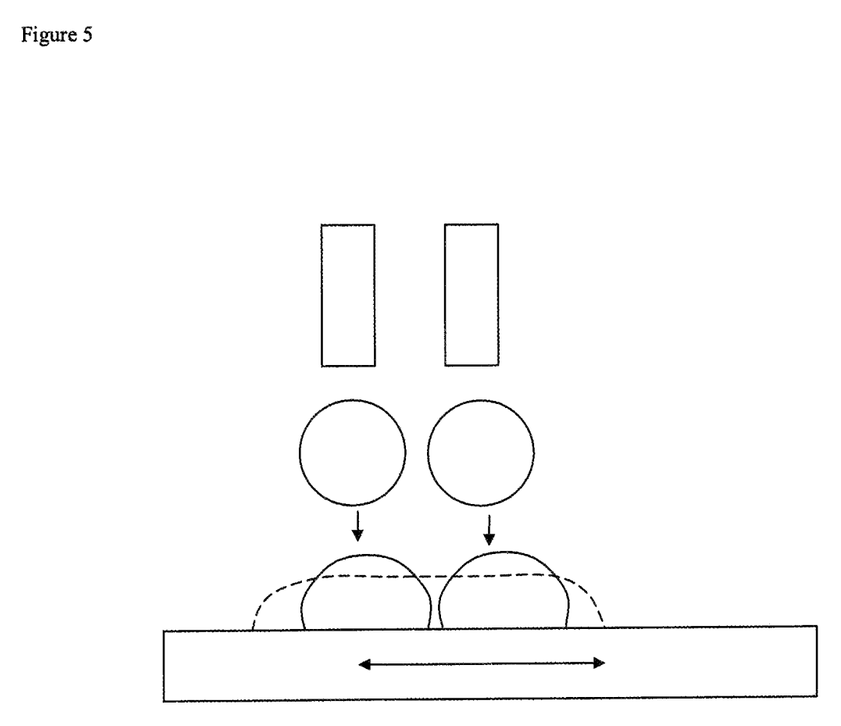
FIG. 5 illustrates the use of multiple pumps and nozzles to generate a polymer composite with different kinds of polymers during the electrostatic coating process.

In this example, the multiple pumps and nozzles are used to generate a polymer composite with different kinds of polymers during the electrostatic coating process as shown in FIG. 5. This process is used to generate new polymer composite with a ultra small grain boundary.

Example 3

Figure 6:
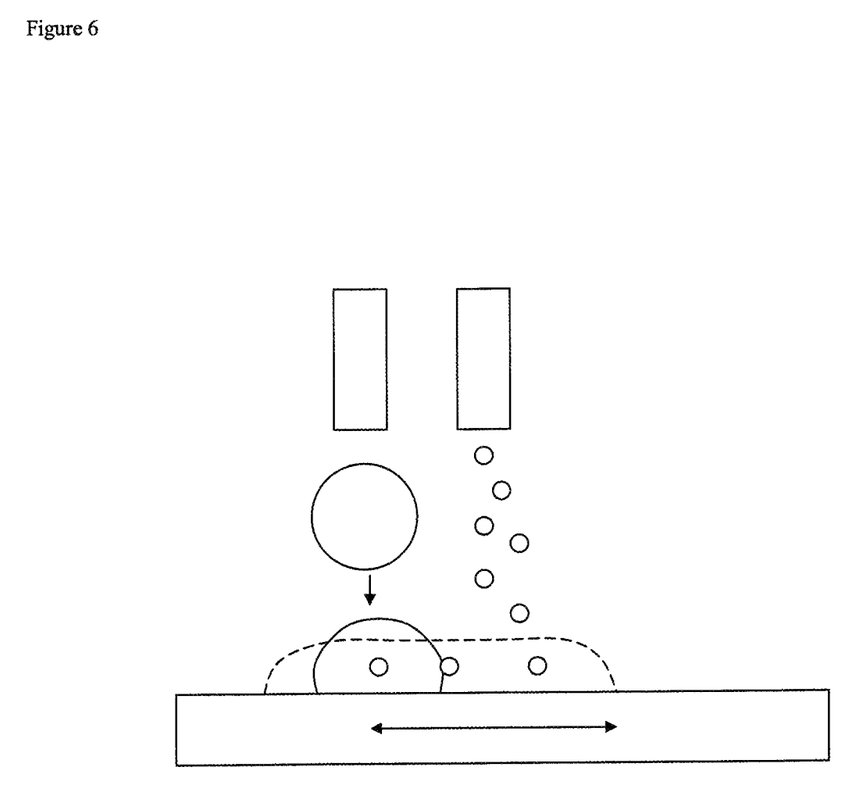
FIG. 6 illustrates the use of the multiple pumps and nozzles to generate a polymer and powder composite during the electrostatic coating process.

In this example, the multiple pumps and nozzles are used to generate a polymer and powder composite during the electrostatic coating process as shown in FIG. 6. This process is used to generate powder and its composite with polymer by mixing of polymer with various kinds of powders.

Example 4

Figure 7:
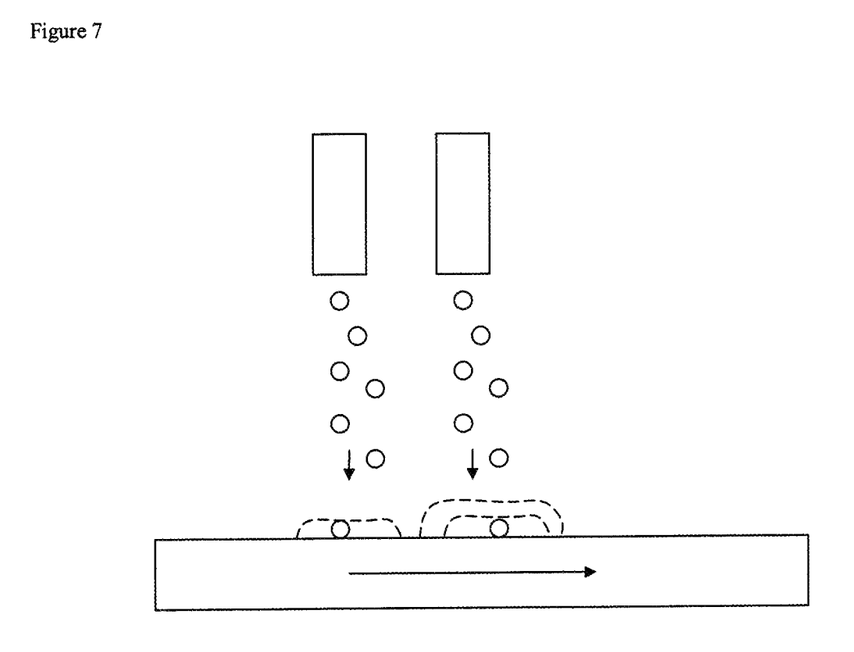
FIG. 7 illustrates the use of multiple pumps, nozzles and a moving conveyer to generate multiple polymer layers during the electrostatic coating process.

In this example, the multiple pumps, nozzles and a moving conveyer are used to generate multiple polymer layers during the electrostatic coating process as shown in FIG. 7. The substrate is placed on a movable conveyer belt that passes through multiple spray nozzles to apply several layers of polymers.

Example 5 in this example, piezoelectric actuation is used to generate one or multiple degrees of freedom vibratory motion during the electrostatic coating process.

Example 6

In this example, electromagnetic actuation is used to generate one or multiple degrees of freedom vibratory motion during the electrostatic coating process.

Example 7

In this example, electrostatic actuation is used to generate one or multiple degrees of freedom vibratory motion during the electrostatic coating process.

Example 8

In this example, pneumatic actuation is used to generate one or multiple degrees of freedom vibratory motion during the electrostatic coating process.

Example 9

In this example, hydraulic actuation is used to generate one or multiple degrees of freedom vibratory motion during the electrostatic coating process.

Example 10

In this example, magnetic actuation is used to generate one or multiple degrees of freedom vibratory motion during the electrostatic coating process.

Example 11

In this example, magnetostrictive actuation is used to generate one or multiple degrees of freedom vibratory motion during the electrostatic coating process.

Example 12

In this example, thermal actuation is used to generate one or multiple degrees of freedom vibratory motion during the electrostatic coating process.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of making a conductive or semi-conductive material having three-dimensional patterned shapes on the surface and a conductive polymer layer covering the three-dimensional pattern shapes, comprising:
(a) patterning a conductive or semi-conductive material to produce a patterned array of high-aspect ratio three-dimensional shaped electrodes or diodes on a surface of the conductive or semi-conductive material, wherein the patterning process is selected from stamping, extrusion, printing, ink-jet printing, lithography, rolling, and combinations thereof;
(b) sintering the pattern array by spark-plasma sintering (SPS) using an SPS tip of at least 1 nm by directing the SPS tip across the patterned array;
(c) applying a high electric field to the patterned array of high-aspect ratio three-dimensional shaped electrodes or diodes, the high electric field ranging from 10 KV to 30 KV;
(d) applying a high frequency vibratory motion to the charged surface of the patterned array of high-aspect ratio three-dimensional shaped electrodes or diodes, the high frequency vibratory motion ranging from 100 to 10,000 Hz; and
(e) ejecting a conductive polymer fluid onto the patterned array of high-aspect ratio three-dimensional shaped electrodes or diodes, wherein the conductive polymer fluid is ejected from at least one nozzle by a high-voltage electrostatic spraying process, the conductive polymer fluid is selected from the group consisting of PEDOT:PSS, polyaniline, PEDOT, polyphenylene vinylidene, polydialkylfluorene, polythiophene, polypyrrole, PVDF, and fluoropolymer, wherein ejecting the conductive polymer fluid ejects a coating being less than 10 nm thick.

2. The method of claim 1, wherein the polymer fluid breaks up into small droplets after being ejected by the at least one nozzle.

3. The method of claim 2, wherein the small droplets of polymer emerge from the nozzle with an electric charge that is opposite to the surface to be coated.

4. The method of claim 2, wherein the small droplets of polymer are attracted to the oppositely charged and vibrating surface.

5. The method of claim 1, further comprising the step of performing photolithography to remove excess polymer fluid.

6. The method of claim 1, further comprising the step of varying the temperature surrounding the surface to be coated.

7. The method of claim 1, further comprising the step of varying the wetness of the polymer fluid.

8. The method of claim 1, further comprising the step of depositing a plurality of layers of polymer fluid onto the surface.

9. The method of claim 1, wherein the polymer fluid is PEDOT:PSS.

10. The method of claim 1, wherein the polymer fluid is a photovoltaic polymer.

11. The method of claim 1, wherein the polymer fluid is a light emitting polymer.

12. The method of claim 1, wherein the polymer fluid is a ferroelectric polymer.

13. The method of claim 1, wherein the polymer fluid is a fluoropolymer.

14. The method of claim 1, wherein the patterned array of high-aspect ratio three-dimensional shaped electrodes or diodes are deposited onto a wire-trace bottom layer, wherein the electrodes are comprised of heated and etched conductive or semi-conductive carbon or carbon allotrope powder material.

15. The method of claim 1, wherein the conductive or semi-conductive material is comprised of polyaniline, PEDOT, polyphenylene vinylidene, polydialkylfluorene, polythiophene, polypyrrole, carbon, or carbon allotrope.

16. A coated electrode layer made according to the process of claim 1.

* * * * *